(12) United States Patent
Dalla Libera et al.

(10) Patent No.: US 6,204,531 B1
(45) Date of Patent: Mar. 20, 2001

(54) NON-VOLATILE MEMORY STRUCTURE AND CORRESPONDING MANUFACTURING PROCESS

(75) Inventors: Giovanna Dalla Libera, Monza; Federico Pio, Brugherio, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/363,429

(22) Filed: Jul. 29, 1999

(30) Foreign Application Priority Data

Jul. 30, 1998 (EP) .................................................. 98202563

(51) Int. Cl.$^7$ .......................... H01L 29/792; H01L 29/76; H01L 29/788

(52) U.S. Cl. .......................... 257/326; 257/288; 257/316; 257/319

(58) Field of Search .................................... 257/326, 288, 257/314, 315, 316, 319, 324

(56) References Cited

U.S. PATENT DOCUMENTS

| | | | |
|---|---|---|---|
| 4,122,543 | * 10/1978 | Bert et al. | 365/182 |
| 5,151,761 | * 9/1992 | Takebuchi | 357/23.5 |
| 5,338,969 | 8/1994 | Kaya . | |
| 6,023,085 | * 2/2000 | Fang | 257/315 |

FOREIGN PATENT DOCUMENTS 0 002 997    7/1979   (EP) .

OTHER PUBLICATIONS

Patent Abstracts of Japan, vol. 014, No. 550, Non–Volatile Image Memory Device, Sep. 19, 1990.
Patent Abstracts of Japan, vol. 017, No. 613, Manufacture of Semiconductor Device, Jul. 30, 1993.
Patent Abstracts of Japan, vol. 018, No. 311, Optical Storage Device and its Manufacture, Mar. 11, 1994.
European Search Report dated Nov. 20, 1998 with annex on European Application No. EP 98 20 2563.

\* cited by examiner

*Primary Examiner*—Matthew Smith
*Assistant Examiner*—Lex H Malsawma
(74) *Attorney, Agent, or Firm*—Theodore E. Galanthay; Stephen C. Bongini; Fleit, Kain, Gibbons, Gutman & Bongini P.L.

(57) ABSTRACT

A semiconductor non-volatile memory device that includes memory cells and selection transistors. The memory cells each include a floating gate transistor having an active area, source and drain regions, a floating gate, and a control gate, and each of the floating gate transistors is serially coupled to one of the selection transistors. A contact to the control gate is located above the active area. In a preferred embodiment, the contact is substantially aligned with a central portion of the active area. A method for manufacturing a non-volatile memory device on a semiconductor substrate is also provided. According to the method, a poly1 layer is deposited, an interpoly dielectric layer is deposited above the poly1 layer, and a poly2 layer is deposited above the interpoly dielectric layer. A mask is provided to define the control gate, and a Self-Aligned poly2/interpoly/poly1 stack etching is used to define a gate stack structure that includes the control gate and the floating gate. The floating gate is defined using only the mask and the Self-Aligned poly2/interpoly/poly1 stack etching. In one preferred method, a contact to the control gate is formed above the active area.

13 Claims, 11 Drawing Sheets

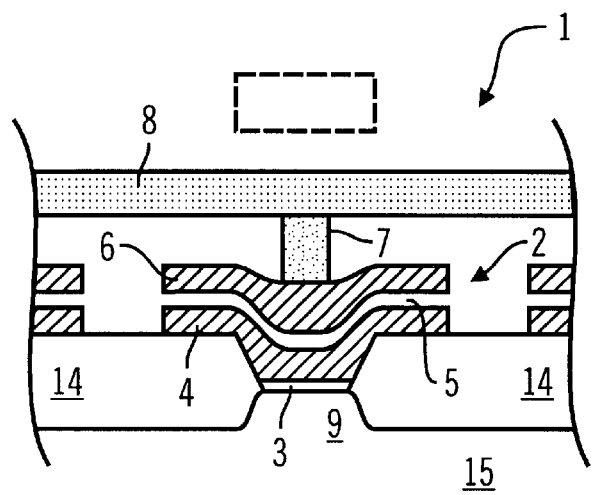
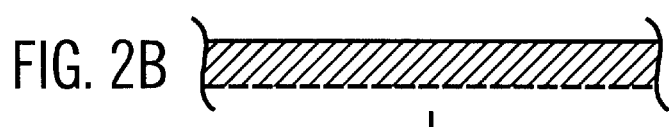
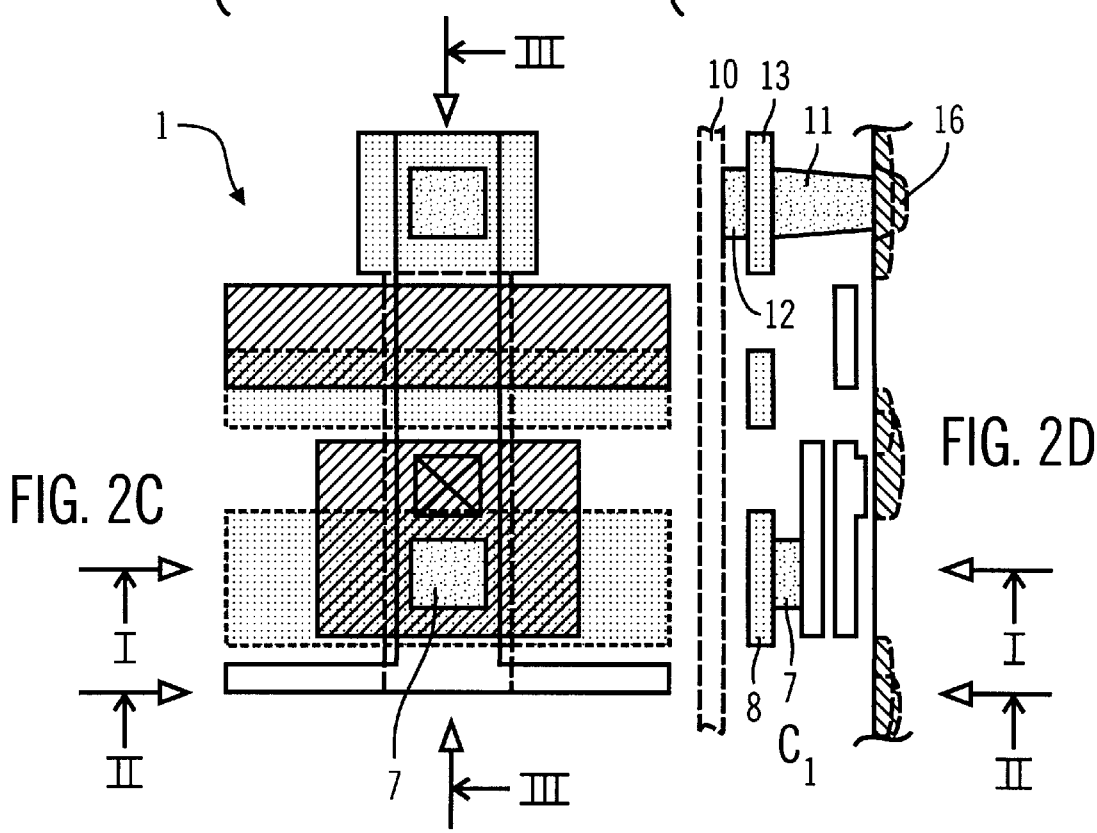

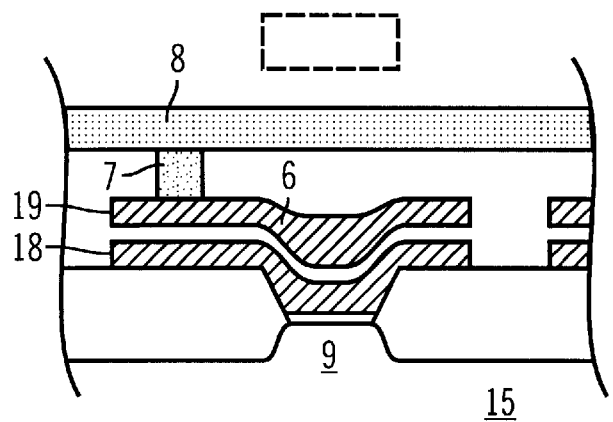
FIG. 3A
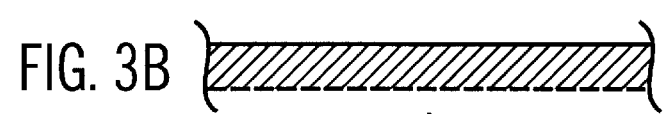
FIG. 3B
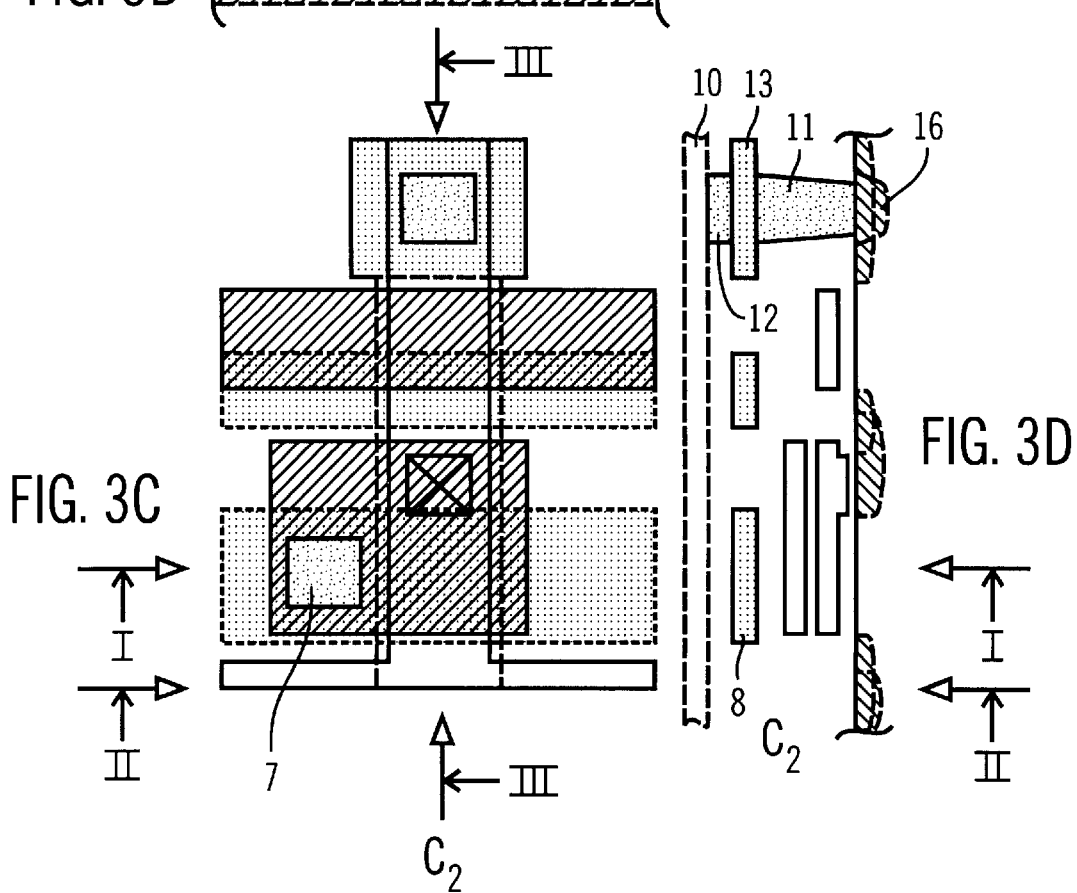
FIG. 3C
FIG. 3D

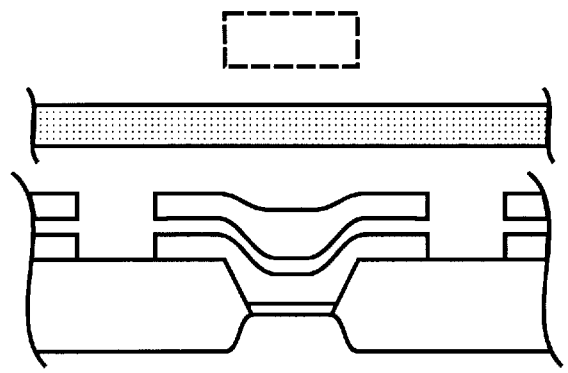
FIG. 4B
FIG. 4A
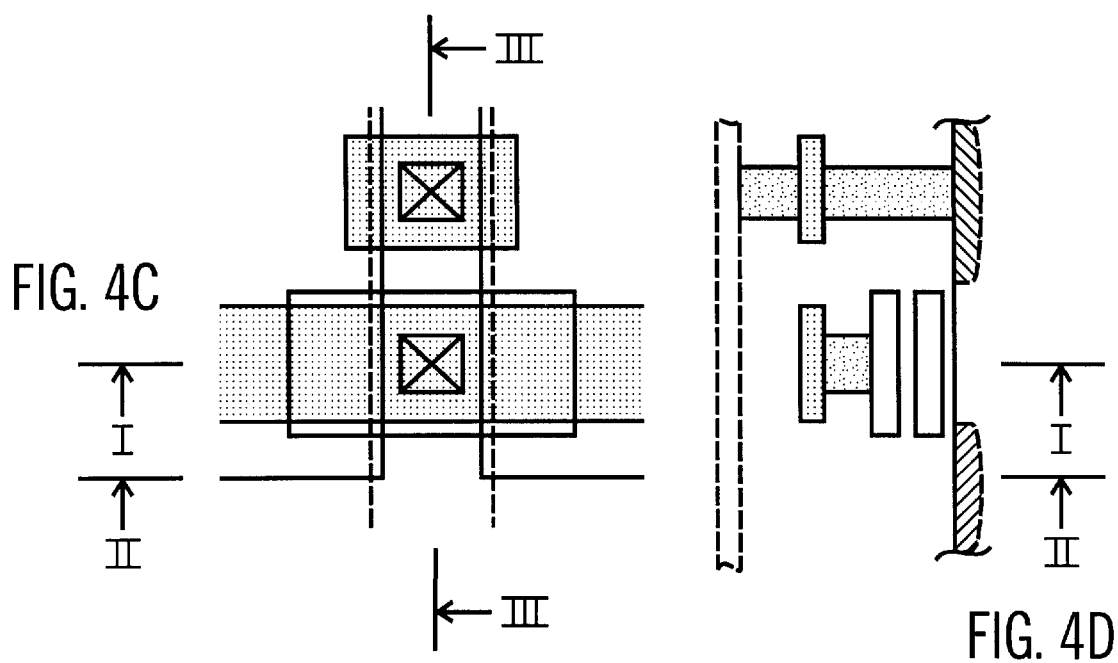
FIG. 4C
FIG. 4D

NON-VOLATILE MEMORY STRUCTURE AND CORRESPONDING MANUFACTURING PROCESS

CROSS-REFERENCE TO RELATED APPLICATIONS

This application is based upon and claims priority from prior European Patent Application No. 98-202563.7, filed Jul. 30, 1998, the entire disclosure of which is herein incorporated by reference.

BACKGROUND OF THE INVENTION

1. Field of the Invention

The present invention relates to semiconductor memory devices, and more specifically to a non-volatile semiconductor memory device having memory cells that each include a floating gate transistor serially connected to a selection transistor and a process for manufacturing the same.

2. Description of Related Art

The memory cells of a conventional non-volatile semiconductor memory device each include a floating gate transistor having an active area, source/drain regions, and a control gate coupled to a floating gate. The floating gate transistor is serially connected to a selection transistor. Double-poly technology is widely used in the manufacturing of such non-volatile memory devices (e.g., EPROMs, EEPROMs, or Flash-EEPROMs) to realize the floating gate transistors.

Conventionally, in order to realize a memory device including non-volatile memory cells in a double-poly technology, it is necessary to use a set of standard CMOS process masks that include at least the following masks: POLY1 mask for defining the floating gates, MATRIX (or interpoly dielectric) mask to remove the interpoly dielectric protection of the memory array, and POLY2 (or control gates) mask for defining the poly lines that form the control gates of the memory cells. Other masks are usually also necessary for manufacturing a specific kind of non-volatile memory cell. For example, a specific mask for N+ implant is required for EEPROMs, implant masks are required for source and/or drain junction engineering in Flash-EFPROMs, and a Self-Aligned-Source mask is used to obtain a source diffusion aligned to the polysilicon lines.

Because the mask count is a cost issue for economic production, and also because the increasing number of metallization levels required for interconnections is impacting the cycle-time in the production line, it is desirable to reduce the number of masks required to realize a non-volatile memory cell, while at the same time maintaining the same cell features. However, a problem specifically related to the manufacturing of non-volatile memory cells with a compact layout concerns the POLY1 mask. With reference to FIGS. 1A through 1D, the POLY1 mask is used to cross the active area on the diffusion region used as a source line for the memory array.

The floating gates must be defined in a direction that is parallel to the word lines, and this is obtained by etching the poly1 layer with a sufficient extension beyond the future control gate line. In this manner, assuming a "self-aligned" process, any short between floating gates of adjacent cells is avoided when the floating gate is defined in the other direction by the poly2/interpoly/poly1 stack etching. Therefore, in the regions in which POLY1 crosses the active areas, no poly1 layer is left on the active area and during the stack etching a consistent substrate etching is provided by the trench 20, as shown in FIG. 1B. This substrate etching is unavoidable because poly2 etching can be stopped on interpoly dielectric, while the interpoly dielectric etch is stopped on poly1, but in the overlapping regions poly1 is not present and the etching is stopped only on the active area.

As a result, the interpoly dielectric etching is stopped on the silicon substrate, but during the poly1 etching the substrate is also etched. For this reason, the source line will not be flat and, even if this is not a severe problem because an N+ implant for source and drain can guarantee the electrical continuity of the source line, there is a serious drawback in that the source resistance is increased as compared to a typical N+ diffusion of a flat cross section. Moreover, if the manufacturing process includes a phase of active area salicidation (as in most advanced technologies now used), the source line irregularity can cause further problems due to reaction of the metal (i.e., Ti) with silicon. More particularly, the metal reaction involves regions with a low doping concentration (e.g., the bottom corner of the etched source line portion), so a short between the N+ diffused substrate region can occur.

The problem of silicon etching in the source line and the corresponding increase in the source resistance is particularly severe in the case of EEPROM memory devices for which the bits of the same byte must be adjacent for construction. Moreover, the control gates are separated at byte level in order to allow byte granularity both in write and erase phases. The inability to divide the bits leads to an enhanced series resistance effect during the reading phase, because all the bits of the same byte can drain current and a correspondingly increased voltage drop on the source line occurs. The only possible solution that has been proposed is to introduce more frequent source contacts. However, this causes a corresponding overall circuit area increase of the memory device.

SUMMARY OF THE INVENTION

In view of these drawbacks, it is an object of the present invention to overcome the above-mentioned drawbacks and to provide a solution to any problems related to the substrate etching in the source line. Such problems can be of a technological nature if related to salicidation or of an electrical nature if related to excessive source line resistivity.

Another object of the present invention is to provide a memory structure having control gate lines with an intrinsic low resistivity. The control gate line resistance related to the poly2 layer sheet resistivity is very important to reduce the access resistance, and therefore the access time to the memory array.

A further object of the present invention is to provide a memory structure that allows a cell area reduction without the need for a Self-Aligned-Source mask and, at the same time, avoids the problem of potential dielectric breakdown between control gate line and source diffusion. Memory devices manufactured without a Self-Aligned-Source process and with an extra dedicated mask require a sufficient distance between the poly2 control gate and the source active area, otherwise the control gate line can be directly overlapped on the diffusion with only interposition of the interpoly dielectric layer where the poly1 has been removed. Because high voltages are necessary during memory programming phases, there is a breakdown risk for this dielectric layer that can lead to a device failure.

In accordance with preferred embodiments of the present invention, the POLY1 mask is eliminated from the manufacturing process and the floating gates are defined using only a POLY2 mask and a Self-Aligned Poly2/interpoly/Poly1 stack etching. The control gate line is preferably realized by a metal interconnection that is electrically connected to the second polysilicon layer, which represents the physical control gate, and a contact is preferably provided on the control gate over the active area.

One embodiment of the present invention provides a semiconductor non-volatile memory device that includes memory cells and selection transistors. The memory cells each include a floating gate transistor having an active area, source and drain regions, a floating gate, and a control gate, and each of the floating gate transistors is serially coupled to one of the selection transistors. A contact to the control gate is located above the active area. In a preferred embodiment, the contact is substantially aligned with a central portion of the active area.

Another embodiment of the present invention provides a method for manufacturing a non-volatile memory device on a semiconductor substrate. The memory device includes memory cells arranged in a memory array, and each of the memory cells has a floating gate transistor serially coupled to a selection transistor. The floating gate transistor includes an active area, source and drain regions, a floating gate, and a control gate. According to the method, a poly1 layer is deposited, an interpoly dielectric layer is deposited above the poly1 layer, and a poly2 layer is deposited above the interpoly dielectric layer. A mask is provided to define the control gate, and a Self-Aligned poly2/interpoly/poly1 stack etching is used to define a gate stack structure that includes the control gate and the floating gate. The floating gate is defined using only the mask and the Self-Aligned poly2/interpoly/poly1 stack etching. In one preferred method, a contact to the control gate is formed above the active area.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 2A is an enlarged scale cross sectional view of a semiconductor EEPROM memory cell according to a first embodiment of the present invention taken along line I—I of FIG. 2C;

FIG. 2B is a cross sectional view of the semiconductor EEPROM memory cell of FIG. 2A taken along line II—II of FIG. 2C;

FIG. 2C is a top plan view of the EEPROM memory cell of FIG. 2A;

FIG. 2D is a cross sectional view of the semiconductor EEPROM memory cell of FIG. 2A taken along line III—III of FIG. 2C;

FIG. 3A is an enlarged scale cross sectional view of a second embodiment of a semiconductor EEPROM memory cell according to the present invention taken along line I—I of FIG. 3C;

FIG. 3B is a cross sectional view of the semiconductor EEPROM memory cell of FIG. 3A taken along line II—II of FIG. 3C;

FIG. 3C is a top plan view of the EEPROM memory cell of FIG. 3A;

FIG. 3D is a cross sectional view of the semiconductor EEPROM memory cell of FIG. 3A taken along line III—III of FIG. 3C;

FIG. 4A is an enlarged scale cross sectional view of an embodiment of a semiconductor EPROM or Flash-EEPROM memory cell according to the present invention taken along line I—I of FIG. 4C;

FIG. 4B is a cross sectional view of the semiconductor EPROM or Flash-EEPROM memory cell of FIG. 4A, taken along line II—II of FIG. 4C;

FIG. 4C is a top plan view of the memory cell of FIG. 4A;

FIG. 4D is a cross sectional view of the memory cell of FIG. 4A taken along line III—III of FIG. 4C;

DETAILED DESCRIPTION OF PREFERRED EMBODIMENTS

Figure 1A:
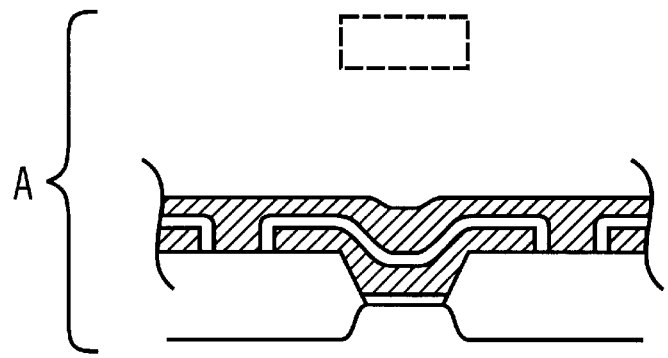
FIG. 1A is an enlarged scale cross sectional view of a conventional semiconductor EEPROM memory cell taken along line I—I of FIG. 1C.
Figure 1B:
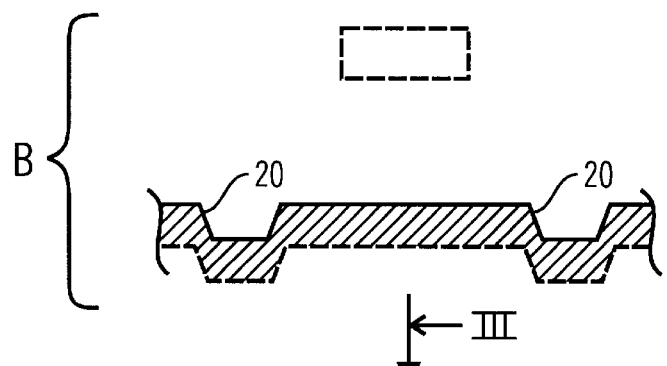
FIG. 1B is a cross sectional view of the semiconductor EEPROM memory cell of FIG. 1A taken along line II—II of FIG. 1C.
Figure 1C:
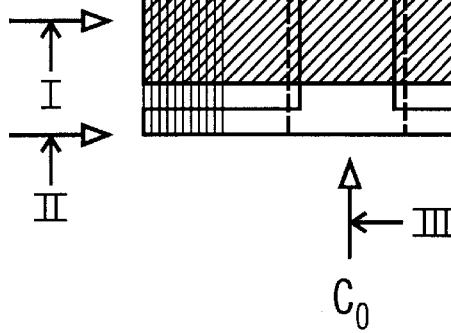
FIG. 1C is a top plan view of the EEPROM memory cell of FIG. 1A.
Figure 1D:
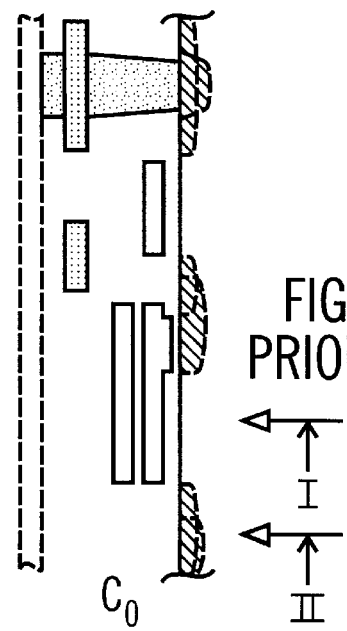
FIG. 1D is a cross sectional view of the semiconductor EEPROM memory cell of FIG. 1A taken along line III—III of FIG. 1C.

Preferred embodiments of the present invention will be described in detail hereinbelow with reference to the attached drawings.

FIGS. 2A, 2B, 2C, and 2D show a non-volatile memory cell according to a first embodiment of the present invention. As shown, the EEPROM memory cell 1 is integrated on a semiconductor substrate 15 of the P type and includes two levels of polysilicon. (While reference will be made in the ensuing description to a preferred embodiment employing devices of the N type, corresponding devices of the P type are formed by simply reversing the types of conductivities mentioned hereinafter.) The memory cell 1 includes a floating gate transistor and an associated selection transistor, which is used for selecting a cell to be programmed from a group of cells in a memory matrix.

The floating gate transistor includes an active area, a drain region 16, and a source region. The active area is delimited by field oxide regions 14, and the drain region 16 is formed by an N-type implant into the substrate 15. The source region of the cell 1 is formed by implanting the substrate 15 with a dopant of the N type. The substrate region 15 provided between the drain 16 and source regions forms the active area channel region 9 of the floating gate transistor. The channel 9 is overlaid by a gate region 2 in an isolated manner with the interposition of an oxide layer 3.

The gate region 2 conventionally includes a floating gate and control gate. In particular the gate region 2 includes a stack aligned structure including a tunnel oxide layer 3, a first polysilicon (poly1) layer 4, an interpoly dielectric layer 5, and a second polysilicon (poly2) layer 6.

In accordance with the present invention, the memory cell 1 is preferably manufactured without a POLY1 mask. The cell layout has been modified as compared to conventional solutions, and the floating gate has been defined in both directions I—I and II—II with the POLY2 mask and the Self-Aligned poly2/interpoly/poly1 stack etching. The cell layout is shown in FIG. 2C. A control gate contact 7 is provided over the second poly2 layer 6. This contact 7 is provided on the gate region 2 over the active area and substantially aligned to the central portion of the channel area 9. A first metallization layer 8 is provided to strap the floating gate transistor of the cell 1 to a selection transistor that is serially connected on the drain side.

The bit line of the memory array is realized by a second metallization level 10 and by an electrical connection 11 to the drain of the cell 1. More specifically, the electrical connection to the drain 16 of the cell 1 is realized through stacked contact that is active to first metal layer 8 and by a contact via 12 between the first metal layer and the second metal layer 10. A first metal layer island is provided around the contact via 12 with appropriate dimensions to avoid any problem in the case of misalignment.

Another embodiment of the memory cell according to the present invention is shown in FIGS. 3A, 3B, 3C, and 3D. The main difference between this alternative layout solution and the previous embodiment is that the control gate contact 7 between the second poly2 layer 6 and the first metal layer 8 is placed on the field oxide, not above the active area. In order to obtain this configuration, a poly1 wing 18 and a poly2 wing 19 are provided to define the control gate capacitive coupling of the floating gate transistor. These wings 18 and 19 are asymmetric with respect to the gate active area of the non-volatile memory cell 1. The advantage of this embodiment is that the contact 7 is realized on a flat region. Additionally, the principle of the present invention may be applied to a Flash-EEPROM or to an EPROM cell as shown in FIGS. 4A, 4B, 4C, and 4D.

The sequence of process phases that are preferably used to obtain either the embodiment of FIG. 2 or the embodiment of FIG. 3 are as follows:

1) standard operations of a double-poly CMOS process are provided for non-volatile memories up to poly1 deposition;
2) interpoly deposition over the poly1 layer 3;
3) a MATRIX mask is used to remove the interpoly dielectric layer 5 outside the memory array;
4) poly2 deposition is performed over the whole circuit layout;
5) a POLY2 or control gate mask is used to expose and define the control gate regions;
6) a poly2/interpoly/poly1 stack etching is provided to define the gate stack structures of the memory array;
7) standard phases are then provided for Source/Drain junction engineering depending on the kind of memory cell, optional salicide formation, interlevel dielectric deposition, contact opening, etc.;
8) preferably, no implant in the control gate contacts 7, poly2 to first metal, are performed in order to reduce the danger of excessive contamination and possible interpoly dielectric degradation. (As an alternative, when salicidation steps are provided and no implant in the contact is required, a dedicated mask is always present for implanting N+ dopant just for N-type contacts, and can be generated so that the control gate is protected from the implant; and
9) The process steps are then completed in the standard manner.

Thus, according to the present invention, the POLY1 mask is eliminated from the process steps and the cell layout is modified in order to define the floating gates with only the POLY2 mask and the Self-Aligned Poly2/interpoly/Poly1 stack etching.

Figure 5C:
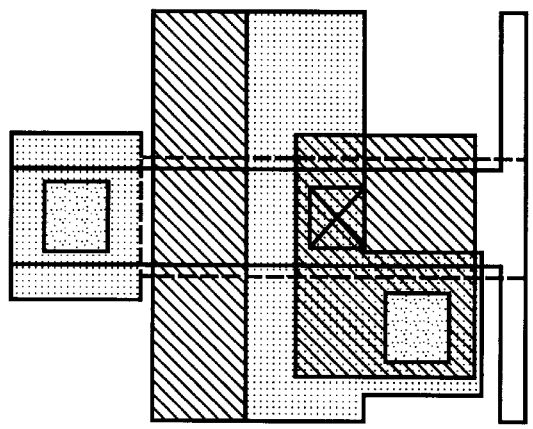
FIGS. 5A, 5B, and 5C are enlarged scale top plan views of a conventional EEPROM memory cell, an embodiment of the present invention, and another embodiment of the present invention, respectively.
Figure 5B:
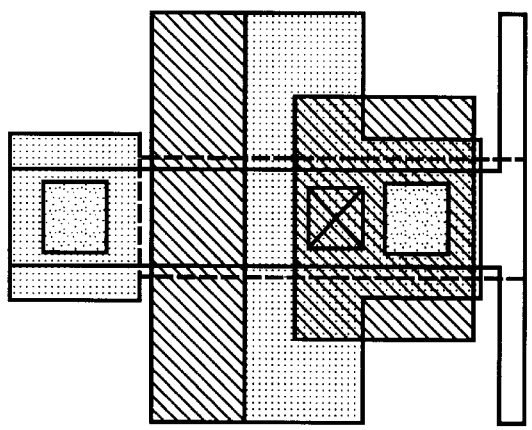
Figure 5A:
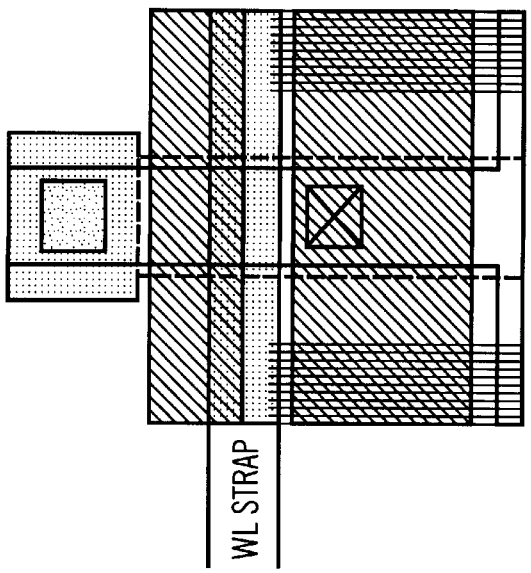

With reference to the example shown in FIG. 5B, a slightly different layout for the memory cell will now be explained. As compared to the first embodiment disclosed above, in this layout the first metal layer of the control gate line has a slightly different shape and does not completely overlap the control gate. Therefore, the metall control gate line does not overlap the poly1/poly2 floating gate region, but it presents a lateral extension over the gate region in order to overlap the poly2/metal1 contact. The layout of a conventional solution is also shown in FIG. 5A. The layout shown in FIG. 5B is used to realize a memory array having a more compact structure, as shown in FIGS. 7A, 7B, 8A, and 8B.

Figure 6A:
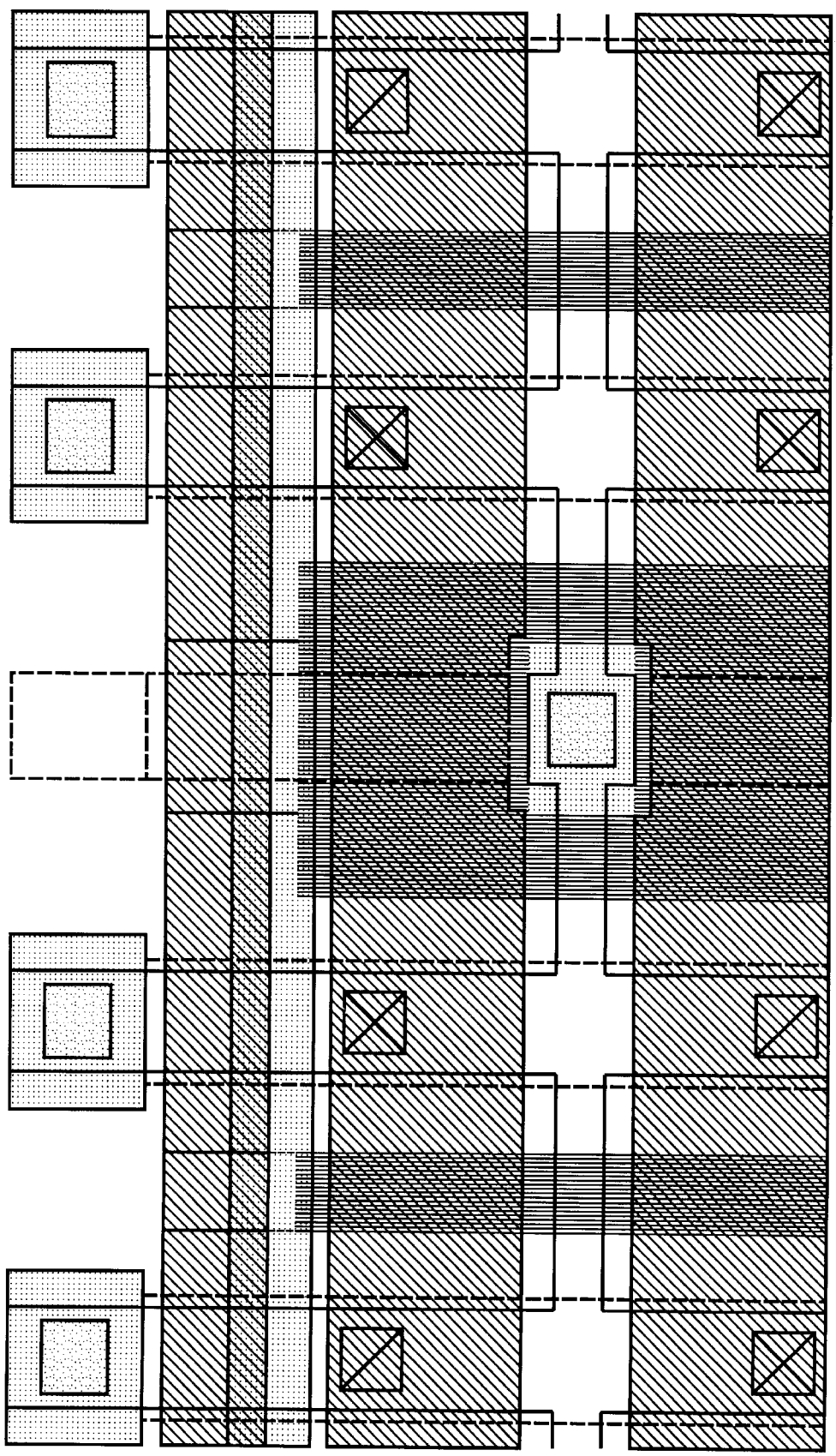
FIGS. 6A and 6B show an enlarged scale layout portion of a semiconductor non-volatile memory device including respectively a source line contact region and a byte switch region realized according to the conventional process.
Figure 6B:
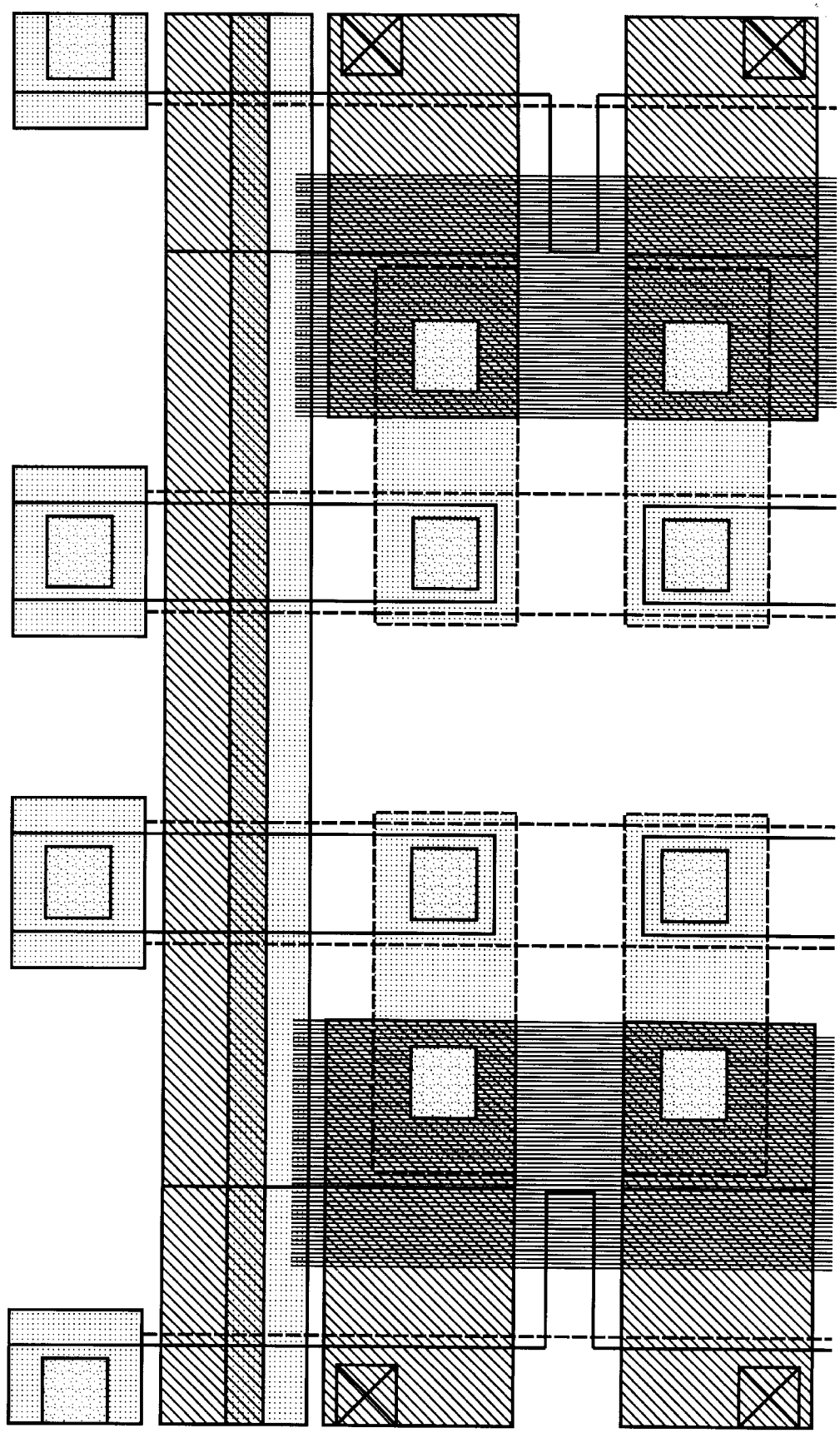
Figure 7A:
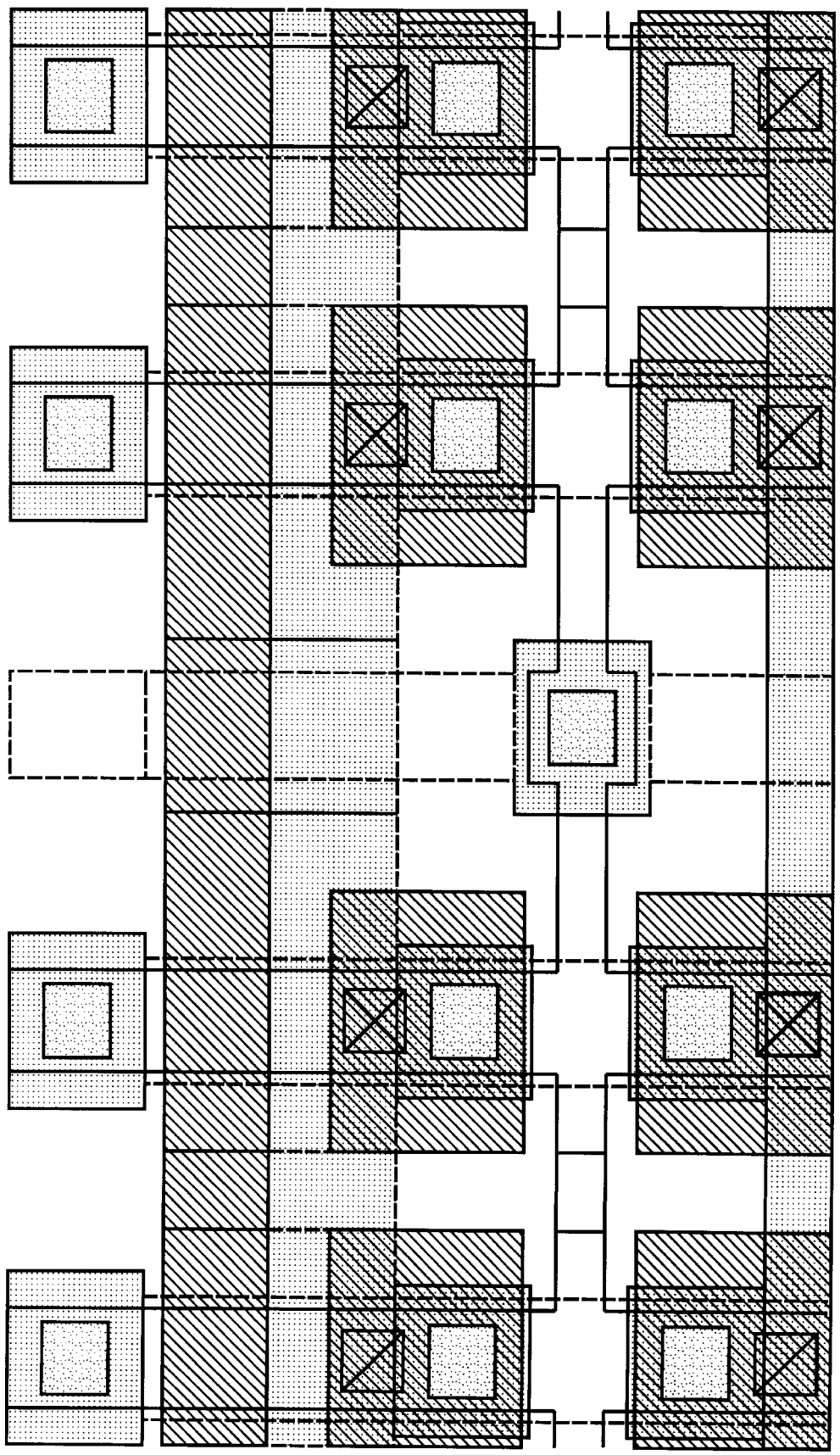
FIGS. 7A and 7B show an enlarged scale layout portion of a semiconductor non-volatile memory device including respectively a source line contact region and a byte switch region realized according to an embodiment of the present invention.
Figure 7B:
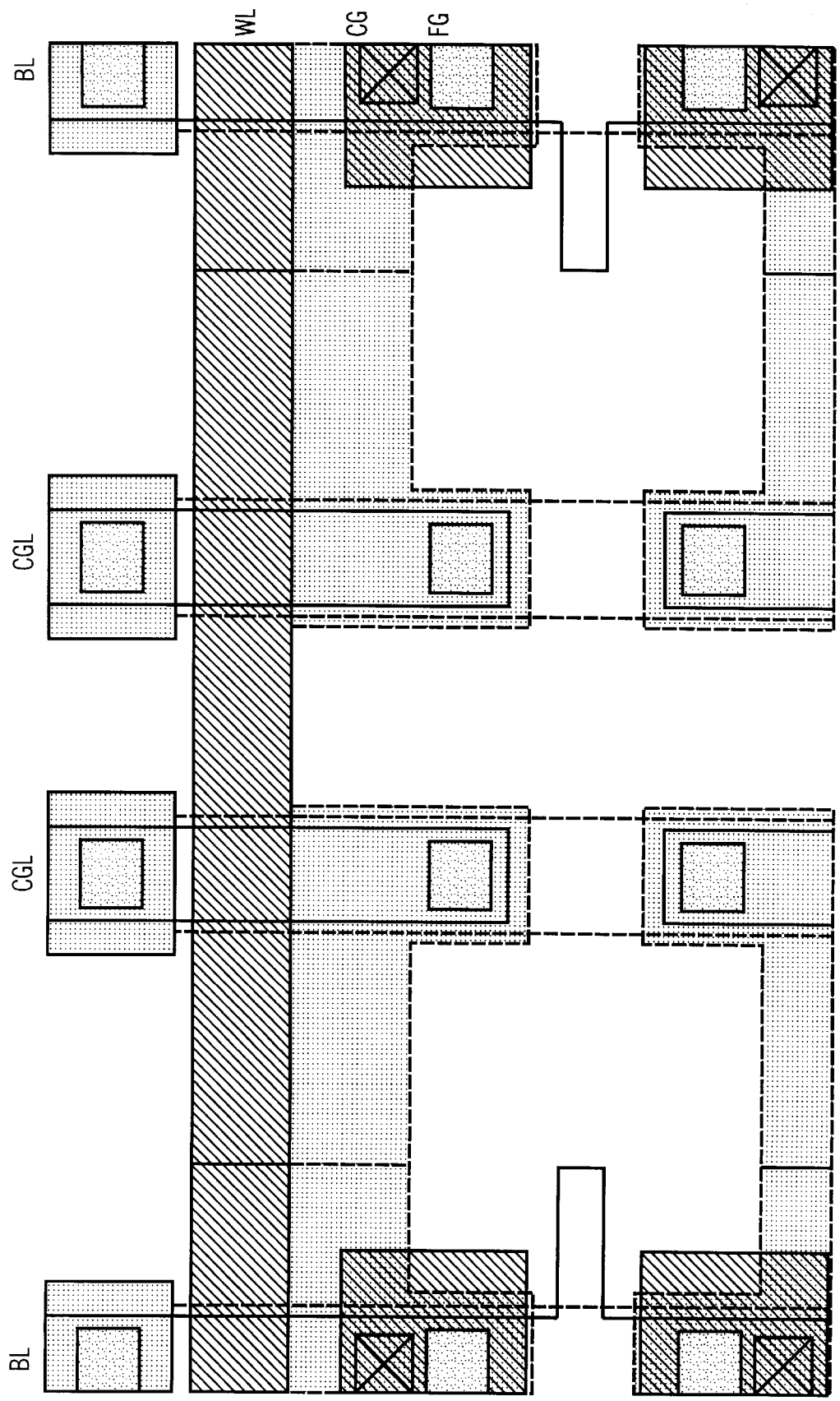

For a better understanding of the present invention, FIGS. 6A and 6B show a layout portion of a conventional solution for an EEPROM memory array in the region in which the source line is contacted and in the region in which a byte is switched, respectively. FIGS. 7A and 7B show a corresponding layout portion of a memory cell according to the first embodiment of the present invention. As shown, more room is available in the region of the byte switch (FIG. 7B) as compared to the conventional solution. While the metal1 control-gate line can be made shorter than the one illustrated in FIG. 6B, the same footprint was kept in order to show the extra space.

Figure 8A:
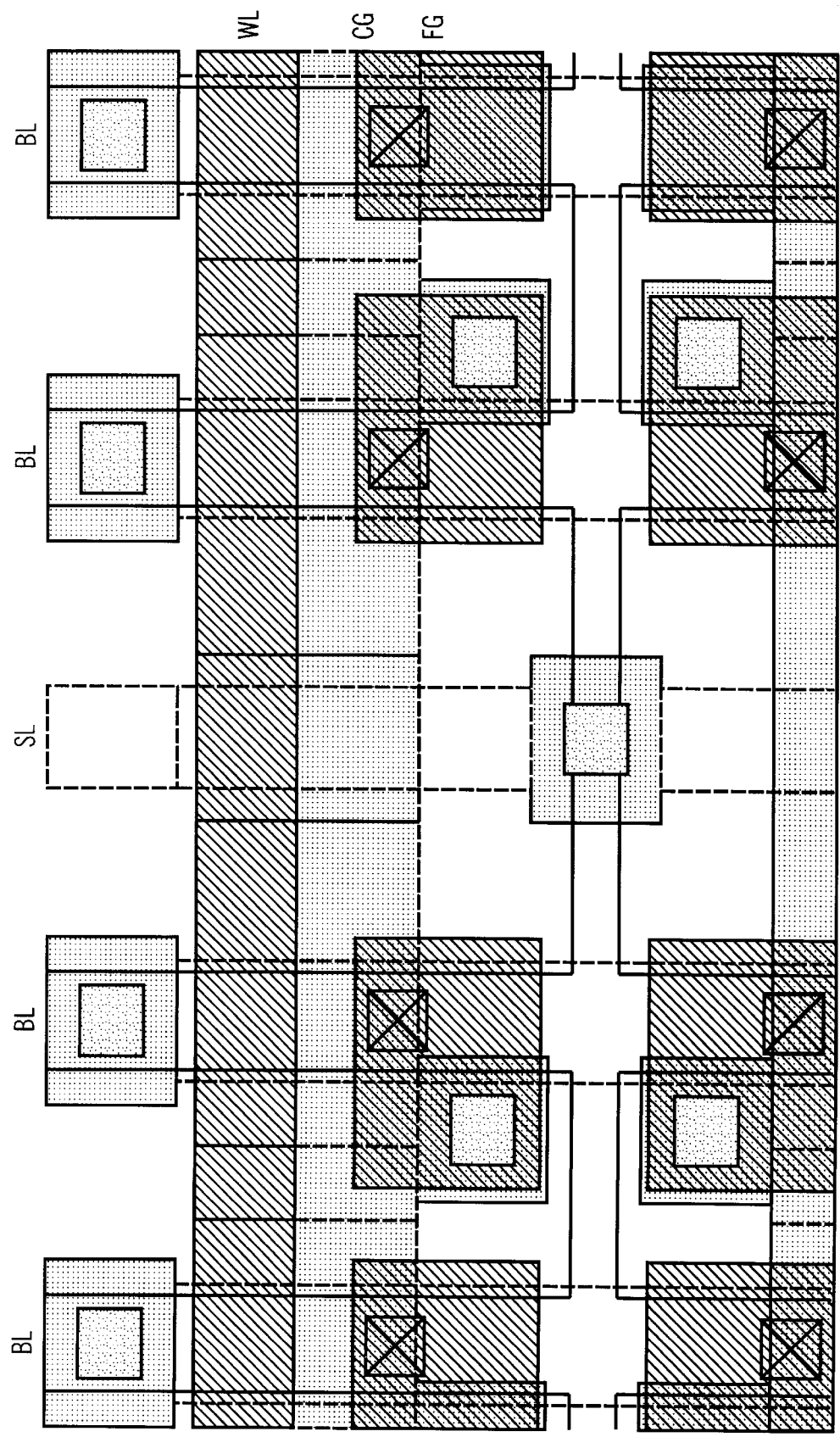
FIGS. 8A and 8B show an enlarged scale layout portion of a semiconductor non-volatile memory device including respectively a source line contact region and a byte switch region realized according to another embodiment of the present invention.
Figure 8B:
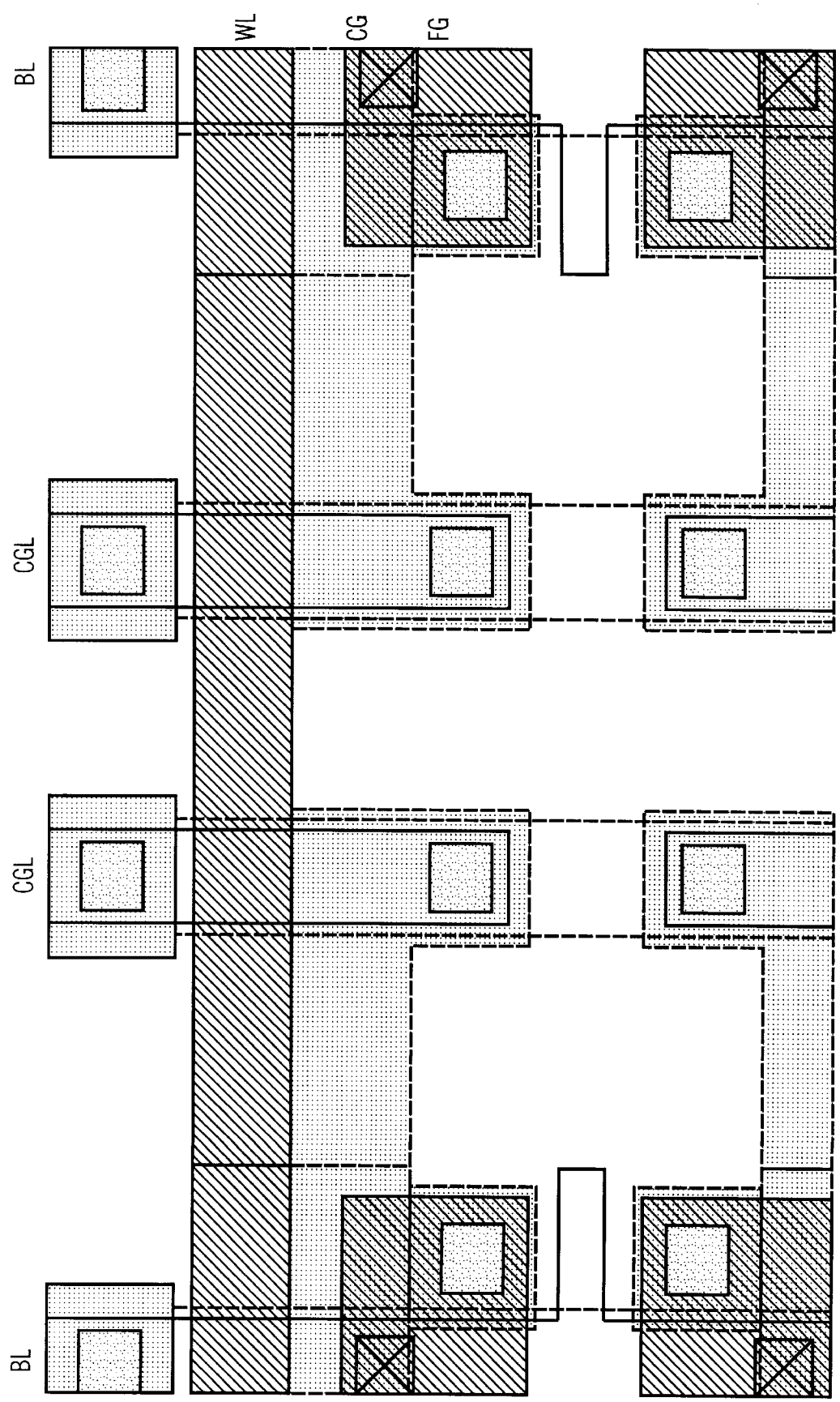

FIGS. 8A and 8B show a corresponding layout portion of a memory cell according to the second embodiment of the present invention. As shown, this embodiment also provides more room both in the region of the byte switch (FIG. 8B) and in the region in which the source is contacted (FIG. 8A). This is due to the asymmetry of the floating gates with respect to bit-line active areas, so the space needed to accommodate the contact on the source is less. The critical rule is the contact distance to the polysilicon. Additionally, in this embodiment, the same footprint as in the conventional solution of FIGS. 6A and 6B has been kept in order to show the extra space.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor non-volatile memory device comprising:
   a plurality of memory cells each including a floating gate transistor having an active area, source and drain regions, a floating gate, and a control gate, a contact to the control gate being located above the active area; and
   a plurality of selection transistors, each of the floating gate transistors being serially coupled to one of the selection transistors,
   wherein each memory cell is coupled to a bit line that is formed by at least a second metal interconnection layer, the bit line being electrically connected to the drain region, and
   the electrical connection of the bit line to the drain region is realized by a stacked contact that is active to a first metal interconnection layer and another contact between the first metal interconnection layer and the second metal interconnection layer.

2. The memory device as defined in claim 1, wherein the contact to the control gate is substantially aligned with a central portion of the active area.

3. The memory device as defined in claim 1,
   wherein the floating gate and control gate are formed with double-poly wings that are symmetric with respect to the active area, and
   the contact to the control gate is located above the double-poly wings.

4. The memory device as defined in claim 1, wherein the memory device is formed by a process that includes the step of:
   defining the floating gate using only a POLY2 mask and a Self-Aligned poly2/interpoly/poly1 stack etching.

5. The memory device as defined in claim 1, wherein the device is a Flash-EEPROM.

6. A semiconductor non-volatile memory device comprising:
   a plurality of memory cells each including a floating gate transistor having an active area, source and drain regions, a floating gate, and a control gate, a contact to the control gate being located above a field oxide region and not above the active area; and
   a plurality of selection transistors, each of the floating gate transistors being serially coupled to one of the selection transistors,
   wherein each memory cell is coupled to a bit line that is formed by at least a second metal interconnection layer, the bit line being electrically connected to the drain region, and
   the electrical connection of the bit line to the drain region is realized by a stacked contact that is active to a first metal interconnection layer and another contact between the first metal interconnection layer and the second metal interconnection layer.

7. A semiconductor non-volatile memory device comprising:
   at least one memory cell including a floating gate transistor that has an active area source and drain regions, a floating gate, and a control gate;
   at least one selection transistor serially coupled to the floating gate transistor;
   a control gate line formed by at least a first metal interconnection layer, the control gate line being electrically connected to the control gate of the memory cell by a contact that is located above the active area; and
   a bit line formed by at least a second metal interconnection layer, the bit line being electrically connected to the drain region,
   wherein the electrical connection of the bit line to the drain region is realized by a stacked contact that is active to the first metal interconnection layer and another contact between the first metal interconnection layer and the second metal interconnection layer.

8. The memory device as defined in claim 7, wherein the contact to the control gate is substantially aligned with a central portion of the active area.

9. The memory device as defined in claim 7, wherein the floating gate and control gate are formed with double-poly wings that are asymmetric with respect to the active area, and
   the contact to the control gate is located above the double-poly wings.

10. The memory device as defined in claim 7, wherein a metal layer island is provided around the other contact.

11. An information handling system including at least one semiconductor non-volatile memory device, said memory device comprising:
    a plurality of memory cells each including a floating gate transistor having an active area, source and drain regions, a floating gate, and a control gate, a contact to the control gate being located above the active area; and
    a plurality of selection transistors, each of the floating gate transistors being serially coupled to one of the selection transistors,
    wherein each memory, cell is coupled to a bit line that is formed by at least a second metal interconnection layer, the bit line being electrically connected to the drain region, and
    the electrical connection of the bit line to the drain region is realized by a stacked contact that is active to a first metal interconnection layer and another contact between the first metal interconnection layer and the second metal interconnection layer.

12. The information handling system as defined in claim 11, wherein the contact to the control gate is substantially aligned with a central portion of the active area.

13. The information handling system as defined in claim 11,
    wherein the floating gate and control gate are formed with double-poly wings that are symmetric with respect to the active area, and
    the contact to the control gate is located above the double-poly wings.

* * * * *